United States Patent
Classen et al.

(10) Patent No.: US 8,461,833 B2
(45) Date of Patent: Jun. 11, 2013

(54) METHOD FOR DETERMINING THE SENSITIVITY OF AN ACCELERATION SENSOR OR MAGNETIC FIELD SENSOR

(75) Inventors: Johannes Classen, Reutlingen (DE); Arnd Kaelberer, Schlierbach (DE); Hans-Joerg Faisst, Kirchentellinsfurt (DE); Axel Franke, Ditzingen (DE); Mirko Hattass, Stuttgart (DE); Holger Rank, Ditzingen (DE); Robert Sattler, Regensburg (DE); Alexander Buhmann, Stuttgart (DE); Ramona Maas, Kaiserslautern (DE); Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 379 days.

(21) Appl. No.: 12/927,259

(22) Filed: Nov. 9, 2010

(65) Prior Publication Data
US 2011/0140692 A1 Jun. 16, 2011

(30) Foreign Application Priority Data
Nov. 18, 2009 (DE) .......................... 10 2009 046 807

(51) Int. Cl.
*G01R 33/02* (2006.01)
*G01R 33/00* (2006.01)
(52) U.S. Cl.
USPC ............................ 324/244; 324/227; 324/200

(58) Field of Classification Search
None
See application file for complete search history.

(56) References Cited

U.S. PATENT DOCUMENTS

| | | | |
|---|---|---|---|
| 6,840,106 B1 | 1/2005 | McNeil | |
| 8,181,522 B2 * | 5/2012 | Scheuerer et al. | ......... 73/514.32 |
| 8,220,330 B2 * | 7/2012 | Miller et al. | ............... 73/514.32 |

FOREIGN PATENT DOCUMENTS

| | | |
|---|---|---|
| DE | 198 27 056 | 12/1999 |
| DE | 101 48 585 | 4/2003 |

* cited by examiner

*Primary Examiner* — Jermele M Hollington
*Assistant Examiner* — Trung Nguyen
(74) *Attorney, Agent, or Firm* — Kenyon & Kenyon LLP

(57) ABSTRACT

A method for determining the sensitivity of a sensor provides the following steps: a) first and second deflection voltages are applied to first and second electrode systems of the sensor, respectively, and first and second electrostatic forces are exerted on an elastically suspended seismic mass of the sensor by the first and second electrode systems, respectively, and a restoring force is exerted on the mass as a result of the elasticity of the mass, and a force equilibrium is established among the first and second electrostatic forces and the restoring force, and the mass assumes a deflection position characteristic of the force equilibrium, and an output signal characteristic of the force equilibrium and of the deflection position is measured; and b) the sensitivity of the sensor is computed on the basis of the first and second deflection voltages.

11 Claims, 2 Drawing Sheets

METHOD FOR DETERMINING THE SENSITIVITY OF AN ACCELERATION SENSOR OR MAGNETIC FIELD SENSOR

BACKGROUND OF THE INVENTION

1. Field of the Invention

The present invention relates to a method for determining the sensitivity of a sensor, e.g., an acceleration sensor or magnetic field sensor.

2. Description of the Related Art

Magnetic field sensors (magnetometers) are used as sensors for detecting the earth's magnetic field for compass applications. Microelectromechanical sensors (MEMS) are known which, using the Lorentz force, convert a magnetic field which is present to a mechanical deflection, and capacitively read out same. For this purpose, these sensors have electrical conductors which extend, at least in places, perpendicular to the magnetic field to be measured. Published German patent application document DE 198 27 056 A1 describes such a magnetic field sensor.

In addition, acceleration sensors are known which are based on capacitively readable microelectromechanical systems (MEMS).

The sensitivity of microelectromechanical sensors is based on various parameters, which may be controlled with varying degrees of success in the manufacturing process and during operation.

The sensitivity of microelectromechanical sensors is influenced, among other factors, by the "edge loss," the difference between the design width of a structure in a functional layer and the structural width in the functional layer which is actually achieved after processing. Edge loss may result, for example, in reduced spring stiffness, seismic mass, and useful capacity for the capacitive evaluation.

For microelectromechanical magnetic field sensors, the sensitivity is influenced in particular by the following parameters:
  the current required for producing the Lorentz force; the accuracy of this current is defined primarily by the evaluation circuit;
  the mechanical sensitivity of the sensor, which is essentially determined by the mechanical stiffness of the spring system, which in turn is a function of:
    process-related variations in the edge loss (width of the spring and/or the total mass) and
    the thickness of the functional layer used (thickness of the spring and/or total mass); and
  the electrostatic sensitivity of the sensor, which varies significantly due to fluctuations in the distance between the electrodes.

For magnetic field sensors which measure a magnetic field component perpendicular to the substrate plane of the sensor ($B_z$ elements), fluctuations in the edge loss essentially result in variation in the distances between the electrodes, and thus result in variation in the base capacitance. Depending on the evaluation principle used ($\Delta C$ or $\Delta C/C$), the thickness of the functional layer may also have an influence. For a $\Delta C$ evaluation the electrostatic sensitivity is a function of the thickness of the functional layer. However, since dependencies in the elasticity and the capacitance compensate each other, the overall sensitivity is independent of these parameters. In contrast, for a $\Delta C/C$ evaluation the electrostatic sensitivity is independent of the thickness of the functional layer. However, due to the spring constant, the overall sensitivity is a function of the functional layer thickness.

For magnetic field sensors which measure magnetic field components parallel to the substrate plane of the sensor ($B_x/B_y$ elements), the electrostatic sensitivity essentially varies as a function of fluctuations in the thickness of the sacrificial layer, which defines the distance between the evaluation electrodes.

Thus, the main causes of variations in the sensitivity of microelectromechanical magnetic field sensors and acceleration sensors are in particular process-related fluctuations in the edge loss, the functional layer thickness, and the sacrificial layer thickness.

These fluctuations may be determined by external mechanical stimulation of the sensors, and then adjusted.

Magnetic field sensors are usually adjusted at the end of the production line. The magnetic field sensors are exposed to a well-defined, homogeneous, external magnetic field of known magnitude, the sensitivity and the zero error (offset) are ascertained, and then brought to the desired value by correction of parameters internal to the sensor, for example offset bits. Other characteristic curve parameters, such as the temperature coefficient of the offset (TKO) and of the sensitivity (TKE), as well as nonlinearities, etc., may also be adjusted. In that case, however, the process is more complicated.

To allow a mechanical sensitivity adjustment to be dispensed with it is necessary, among other things, to have the most accurate knowledge possible concerning the edge loss.

Published German patent application document DE 10148585 A1, U.S. Pat. No. 5,618,989, and U.S. Pat. No. 6,840,106 B1 propose methods for checking the functionality of acceleration sensors.

BRIEF SUMMARY OF THE INVENTION

The present invention provides a method for determining the sensitivity of a sensor, in particular a micromechanical sensor, for example a sensor for capacitively detecting a mechanical deflection, which sensor has a substrate, an elastically supported seismic mass which is movable relative to the substrate, at least one first electrode system for deflecting the mass relative to the substrate along a measuring axis, and at least one second electrode system for deflecting the mass relative to the substrate along the measuring axis. The method includes the following method steps:
  a) applying a first deflection voltage ($U_1$) to the first electrode system and applying a second deflection voltage ($U_2$) to the second electrode system, a first electrostatic force ($F_1$) being exerted on the mass by the first electrode system, a second electrostatic force ($F_2$) being exerted on the mass by the second electrode system, and a restoring force ($F_R$) being exerted on the mass as a result of the elasticity of the mass,
    a force equilibrium being established between first electrostatic force ($F_1$), second electrostatic force ($F_2$), and restoring force ($F_R$), and the mass assuming a deflection position which is characteristic of the force equilibrium, and
    measuring an output signal ($U_A$) which is characteristic of the force equilibrium and of the deflection position, and
  b) computing the sensitivity of the sensor on the basis of first deflection voltage ($U_1$) and second deflection voltage ($U_2$).

Within the scope of the present invention, the phrases "computing on the basis of . . ." or "the computation is based on . . . " are understood in particular to mean that values other than those expressly stated in this regard may be used in the computation.

Within the scope of the present invention, a "deflection voltage" may be a direct-current voltage or also a modulated voltage, for example a sinusoidal, pulsed, and/or pulse width-modulated (PWM) voltage. Within the scope of the present invention, a "deflection voltage" is understood in particular to mean a voltage whose direct-current voltage value or effective value is not zero.

The method according to the present invention has the advantage that it allows the sensitivity of a sensor to be determined and adjusted very precisely, in particular more precisely than with most methods currently known, without subjecting the sensor to external mechanical and/or magnetic stimulation. Thus, a complicated and therefore costly adjustment based on external mechanical or magnetic stimulation may advantageously be dispensed with and the adjustment operation may be simplified. In addition, the adjustment operation may be carried out largely independently of external interference fields. Furthermore, the method according to the present invention advantageously allows the sensitivity of a sensor to be determined and monitored, not only directly after manufacture, but also during subsequent operation of the sensor (in the field), in particular without additional means. In this way, changes in the sensitivity (sensitivity drift) may be detected, and sensor failures may possibly be prevented. In addition, the adjustment operation may be carried out with a test current switched off, so that magnetic fields which impair the adjustment operation may be reduced or even avoided.

As previously described, the method according to the present invention may be designed for adjusting the sensitivity of the sensor. For this purpose, the method may also contain method step c): adjusting the sensor on the basis of the sensitivity computed in method step b).

In one example embodiment of the method, in method step b) the computation of the sensitivity of the sensor is based on a computation of the edge loss ($\delta$) and/or of the predeflection ($x_0$).

"Edge loss" refers in particular to the difference between the design width of a structure and the actual width of a manufactured structure.

"Predeflection," which is also referred to as "raw offset," among other terms, refers to the difference between the non-deflected design position (middle position/zero position) of two structures relative to one another and the actual neutral position of two manufactured structures relative to one another. For example, for manufacturing reasons the actual elasticity may deviate from the design elasticity, and therefore in the neutral position the mass may be deflected relative to the substrate, in particular from the middle position/zero position, by the predeflection. In particular for electrode systems in which one or multiple comb-like substrate electrodes and one or multiple comb-like mass electrodes intermesh, in particular in an alternating manner, the predeflection may refer to the difference between the actual neutral position of the mass electrodes relative to the substrate electrodes and the middle position of the mass electrodes relative to the substrate electrodes, in which a comb tooth of a mass electrode is centrally located between comb teeth of one or multiple substrate electrodes, which in particular for $\Delta C/C$ and $\Delta C$ evaluation corresponds to the zero position, since in this position the output signal, i.e., the output voltage, of the electrode system corresponds to zero volts.

In principle, method step a) may be carried out multiple times, for example using different first and/or second deflection voltages, and therefore different deflection positions and output signals $U_A$. Based on the values obtained in this manner, the sensitivity and/or the edge loss of the predeflection, in particular of the voltage(s) for reaching the middle position/zero position or the neutral position, may be ascertained by extrapolation.

DETAILED DESCRIPTION OF THE INVENTION

Figure 1:
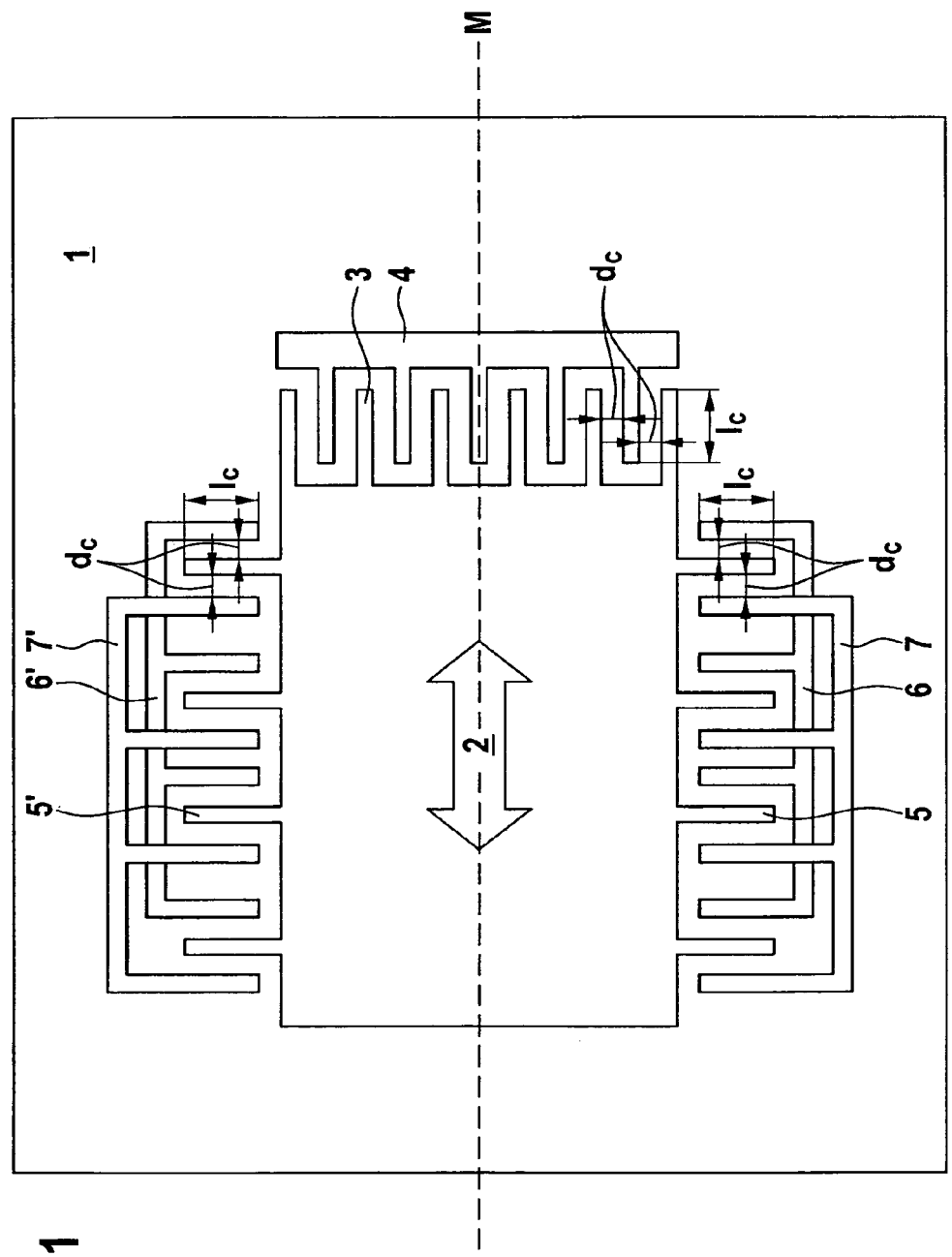
FIG. 1 shows a schematic top view of one example embodiment of a sensor according to the present invention which is suitable for carrying out the method according to the present invention, and which has no electrode system on one side of the mass.

FIG. 1 shows that the sensor has a substrate 1, an elastically supported seismic mass 2 which is movable relative to substrate 1, and three electrode systems 3, 4; 5, 6, 7; 5', 6', 7' for deflecting mass 2 relative to substrate 1 along measuring axis M. The springs for movably suspending mass 2 are not illustrated in FIG. 1. FIG. 1 shows that first electrode system 3, 4 is situated on a first side of mass 2, and second electrode system 5, 6, 7 is situated on a second side of mass 2. FIG. 1 also shows that a further electrode system 5', 6', 7' is situated on the side of the mass located opposite the second side. However, according to the present invention no electrode system is provided on the side of mass 2 located opposite the first side. This has the advantage that the surface area of the sensor may be reduced.

FIG. 1 also shows that second electrode system 5, 6, 7 and further electrode system 5', 6', 7' are capacitor electrode systems in which the distance between electrodes 5, 6, 7; 5', 6', 7' changes when mass 2 is displaced along measuring axis M. FIG. 1 also shows that first electrode system 3, 4 is a capacitor electrode system whose electrodes 5, 6, 7; 5', 6', 7' move parallel to one another when mass 2 is displaced along measuring axis M.

FIG. 1 further shows that the electrodes of first, second, and further electrode systems 3, 4; 5, 6, 7; 5', 6', 7' are designed in the form of comb electrodes having a comb spine and comb teeth. FIG. 1 shows that the comb teeth of an electrode system 3, 4; 5, 6, 7; 5', 6', 7' are oriented in parallel to each other and in an interspaced and alternating manner. FIG. 1 also shows that the comb teeth of second electrode system 5, 6, 7 are oriented parallel to the comb teeth of further electrode system 5', 6', 7', and the comb teeth of first electrode system 3, 4 are oriented perpendicular to the comb teeth of second electrode system 5, 6, 7 and of further electrode system 5', 6', 7'.

FIG. 1 also shows effective length $l_C$ of the comb teeth of second electrode system 5, 6, 7 and of further electrode system 5', 6', 7' in the form of a plate capacitor, and distance $d_C$ between the comb teeth of electrodes of first electrode system 3, 4, second electrode system 5, 6, 7, and further electrode system 5', 6', 7', in the middle position/zero position without edge loss.

In particular, FIG. 1 shows that first electrode system 3, 4 has a comb-like substrate electrode 4 provided on substrate 1, and a comb-like mass electrode 3 provided on mass 2, the comb teeth of substrate electrode 4 being situated between the comb teeth of mass electrode 3.

FIG. 1 further shows that second electrode system 5, 6, 7 and further electrode system 5', 6', 7' each have a first 6; 6' and a second 7; 7' comb-like substrate electrode provided on substrate 1, and have a comb-like mass electrode 5, 5' provided on the mass, the comb teeth of mass electrode 5, 5' of an electrode system each being situated between one comb tooth of first substrate electrode 6; 6' and one comb tooth of second substrate electrode 7; 7' of the electrode system, and forming differential capacitors 5, 6, 7; 5', 6', 7'.

Figure 2:
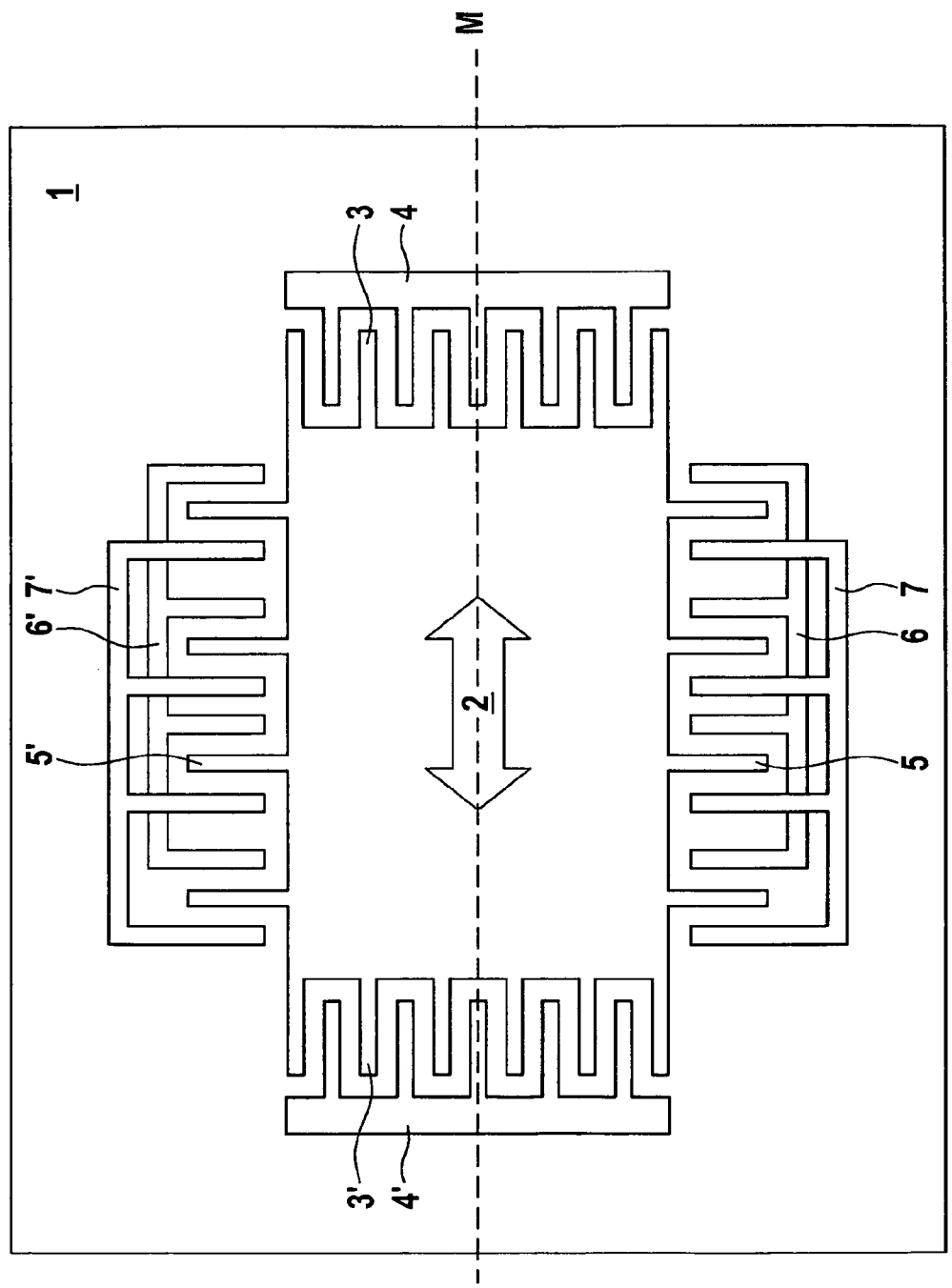
FIG. 2 shows a schematic top view of a sensor which is suitable for carrying out the method according to the present invention, having four electrode systems.

The sensor shown in FIG. 2 differs from that shown in FIG. 1 in that the sensor has four electrode systems 3, 4; 5, 6, 7; 3', 4'; 5', 6', 7', an electrode system 3', 4' which is similar to first electrode system 3, 4 also being situated on the side of mass 2 located opposite the first side.

An example embodiment of the method according to the present invention includes the following method steps:

a) applying a first deflection voltage ($U_1$) to the first electrode system and applying a second deflection voltage ($U_2$) to the second electrode system, a first electrostatic force ($F_1$) being exerted on the mass by the first electrode system, a second electrostatic force ($F_2$) being exerted on the mass by the second electrode system, and a restoring force ($F_R$) being exerted on the mass as a result of the elasticity of the mass, a force equilibrium being established between first electrostatic force ($F_1$), second electrostatic force ($F_2$), and restoring force ($F_R$), and the mass assuming a deflection position which is characteristic of the force equilibrium, and measuring an output signal ($U_A$) which is characteristic of the force equilibrium and of the deflection position, and b) computing the sensitivity of the sensor on the basis of first deflection voltage ($U_1$) and second deflection voltage ($U_2$).

In another example embodiment of the method, the method includes the following method step prior to method step a):

$a_0$) measuring an output signal ($U_{A,x0}$) which is characteristic of the starting position, in particular the neutral position, in particular using the second electrode system or using a detection element, no deflection voltages, in other words, a deflection voltage of zero volts ($U_1=U_2=U_3=U_4=0$ V), being applied to the electrode systems.

In another example embodiment of the method, in method step b) the sensitivity of the sensor, i.e., edge loss ($\delta$) and/or predeflection ($x_0$), is computed on the basis of first deflection voltage ($U_1$) and second deflection voltage ($U_2$), and output signal ($U_A$), for example output signal ($U_{A,x0}$) which is characteristic of the starting position, in particular neutral position ($x_0$).

In another example embodiment of the method, the method includes the following method steps:

$a_0$) measuring an output signal ($U_{A,x0}$) which is characteristic of starting position ($x_0$), in particular the neutral position, in particular using the second electrode system or using a detection element, no deflection voltages ($U_1$, $U_2$, $U_3$, $U_4$) being applied to the electrode systems, a) applying a first deflection voltage ($U_1$) to the first electrode system, the mass being deflected from starting position ($x_0$) in a first direction along the measuring axis to a first deflection position ($x_1$), applying a second deflection voltage ($U_2$) to the second electrode system, second deflection voltage ($U_2$) being set in such a way that the mass is guided from first deflection position ($x_1$) back to starting position ($x_0$), in particular the neutral position, the reaching of starting position ($x_0$), in particular the neutral position, being determined by measuring output signal ($U_{A,x0ref}$) which is characteristic of the return to starting position ($x_0$), in particular using the second electrode system or using the detection element, and b) computing the sensitivity of the sensor on the basis of output signal ($U_{A,x0}$) which is characteristic of starting position ($x_0$), or on the basis of output signal ($U_{A,x0ref}$) which is characteristic of the return to starting position ($x_0$), and computing first detection voltage ($U_1$) and second deflection voltage ($U_2$).

In other words, second deflection voltage ($U_2$) is set in particular in such a way that output signal ($U_A$) which is measured in method step b) corresponds to output signal ($U_{A,x0}$) which is characteristic of the return to starting position ($x_0$).

By applying first deflection voltage ($U_1$) to the first electrode system, a first electrostatic force ($F_1$) may be exerted on the mass in addition to restoring force ($F_R$) from the elasticity of the mass. By applying second deflection voltage ($U_2$) to the second electrode system, a second electrostatic force ($F_2$) may be exerted on the mass in addition to restoring force ($F_R$) from the elasticity of the mass and first electrostatic force ($F_1$) of the first electrode system. First electrostatic force ($F_1$) is preferably oriented in the opposite direction from second electrostatic force ($F_2$). When the mass is guided from first deflection position ($x_1$) back to starting position ($x_0$), in particular the neutral position, in starting position ($x_0$) a force equilibrium may be established between first electrostatic force ($F_1$), second electrostatic force ($F_2$), and restoring force ($F_R$).

In another example embodiment of the method, the sensor also includes a third electrode system for deflecting the mass relative to the substrate along the measuring axis, and a fourth electrode system for deflecting the mass relative to the substrate along the measuring axis. A third deflection voltage ($U_3$) may be applied to the third electrode system, and a fourth deflection voltage ($U_4$) may be applied to the fourth electrode system. In method step b) the sensitivity of the sensor, i.e., edge loss ($\delta$) and/or predeflection ($x_0$), may be computed on the basis of first ($U_1$), second ($U_2$), third ($U_3$), and fourth ($U_4$) deflection voltages.

The method preferably includes the following method steps:

a) applying a first deflection voltage ($U_1$) to the first electrode system, the mass being deflected from starting position ($x_0$) in a first direction along measuring axis (M) to a first deflection position ($x_1$), applying a second deflection voltage ($U_2$) to the second electrode system, second deflection voltage ($U_2$) being set in such a way that the mass is guided from first deflection position ($x_1$) to the middle position/zero position (the position, for example, in which a comb tooth of a mass electrode is centrally located between comb teeth of one or multiple substrate electrodes, and in which output signal $U_A$ corresponds to zero), the reaching of the middle position/zero position being determined by measuring output signal ($U_A=0$) which is characteristic of the middle position/zero position, in particular using the second and/or fourth electrode system and/or using a detection element, $a_1$) applying a third deflection voltage ($U_3$) to the third electrode system, the mass being deflected from starting position ($x_0$) in a second direction opposite to the first direction, along measuring axis (M) to a second deflection position ($x_2$), applying a fourth deflection voltage ($U_4$) to the fourth electrode system, fourth deflection voltage ($U_4$) being set in such a way that the mass is guided from second deflection position ($x_2$) to the middle position/zero position, the reaching of the middle position/zero position being determined by measuring output signal ($U_A=0$) which is characteristic of reaching the middle position/zero position, in particular using the second and/or fourth electrode system and/or using the detection element, b) computing the sensitivity of the sensor on the basis of first ($U_1$), second ($U_2$), third ($U_3$), and fourth ($U_4$) deflection voltages.

Similarly as for the previously described method procedure, a first electrostatic force ($F_1$) may be exerted on the mass, in addition to restoring force ($F_R$) from the elasticity of the mass, by applying first deflection voltage ($U_1$) to the first electrode system, and a second electrostatic force ($F_2$) may be exerted on the mass by applying second deflection voltage ($U_2$) to the second electrode system. First electrostatic force ($F_1$) is likewise preferably oriented in the opposite direction from second electrostatic force ($F_2$). When the mass is guided from first deflection position ($x_1$) back to the middle position/zero position, in the middle position/zero position a force equilibrium may likewise be established between first electrostatic force ($F_1$), second electrostatic force ($F_2$), and restoring force ($F_R$).

After completion of method step a), first deflection voltage ($U_1$) and second deflection voltage ($U_2$) are preferably removed from the first and second electrode systems, respectively.

In method step $a_1$) a third electrostatic force ($F_3$) may then be exerted on the mass, in addition to restoring force ($F_R$) from the elasticity of the mass, by applying third deflection voltage ($U_3$) to the third electrode system, and a fourth electrostatic force ($F_4$) may be exerted on the mass by applying fourth deflection voltage ($U_4$) to the fourth electrode system. Third electrostatic force ($F_3$) is preferably oriented in the opposite direction from fourth electrostatic force ($F_4$). First electrostatic force ($F_1$) may, for example, be oriented in the same direction as fourth electrostatic force ($F_4$), and second electrostatic force ($F_2$) may be oriented in the same direction as third electrostatic force ($F_3$). When the mass is guided from second deflection position ($x_2$) back to the middle position/zero position, in the middle position/zero position a force equilibrium may likewise be established between third electrostatic force ($F_3$), fourth electrostatic force ($F_4$), and restoring force ($F_R$).

To improve the sensitivity adjustment, in particular for a weak, damped spring system, the quality of the spring system may be determined within the scope of the method according to the present invention. The quality may be determined, for example, via the decay response of the sensor, in particular as a step response to an electrical test signal. Additionally or alternatively, if the pressure in the region of the mass (pressure confinement) is known, the quality may also be ascertained by computer, based on process parameters estimated using the electrical test signals.

In another example embodiment of the method, the computation of the sensitivity, i.e., edge loss ($\delta$) and/or predeflection ($x_0$), in method step b) is therefore also based on a quality value determined for the spring system.

In another example embodiment of the method, the second and/or the fourth electrode system is/are additionally designed for deflecting the mass relative to the substrate in order to measure the deflection of the mass relative to the substrate, for example for converting a mechanical deflection to an output signal, in particular for measuring an output signal which is characteristic of a deflection position. For example, the second and/or the fourth electrode system may be capacitive distance-voltage converters.

However, the sensor may also include an additional detection element for measuring the deflection of the mass relative to the substrate, for example for converting a mechanical deflection to an output signal, in particular for measuring an output signal which is characteristic of a deflection position. For example, the detection element may be a capacitive distance-voltage converter. The detection element may be a capacitor electrode system, for example, in which the distance between the electrodes changes when the mass is displaced along the measuring axis (capacitive plate actuator). However, the detection element may also be a capacitor electrode system whose electrodes move parallel to one another when the mass is displaced along the measuring axis (capacitive comb actuator). In addition, the detection element may be a piezoelectric converter or an electrode system based on a field effect transistor (moving gate electrode system).

The first and second electrode systems, and the third and fourth electrode systems, preferably have different designs. In particular, the first electrode system may have a first force-distance characteristic curve and the second electrode system may have a second force-distance characteristic curve which is different from the first, and the third electrode system may have a third force-distance characteristic curve and the fourth electrode system may have a fourth force-distance characteristic curve which is different from the third.

In principle, the first, second, third, and fourth electrode systems may be independently designed as capacitive plate actuators or as capacitive comb actuators.

In another example embodiment of the method, the first and/or third electrode system is/are a capacitor electrode system whose electrodes move parallel to one another when the mass is displaced along the measuring axis (capacitive comb actuator), and the second and/or fourth electrode system is/are a capacitor electrode system in which the distance between the electrodes changes when the mass is displaced along the measuring axis (capacitive plate actuator).

However, it is also possible, for example, for the first and second and/or the third and fourth electrode systems to be capacitor electrode systems in which the distance between the electrodes changes when the mass is displaced along the measuring axis (capacitive plate actuators). The distance between the electrodes of the first and second electrode systems and/or of the third and fourth electrode systems may be different.

The electrodes of the first and second and/or of the third and fourth electrode systems are preferably designed in the form of comb electrodes having a comb spine and comb teeth. The comb teeth of the electrodes of an electrode system may be oriented in parallel and in an interspaced and alternating manner.

The first and/or third electrode system may have at least one substrate electrode provided on the substrate, and at least one mass electrode provided on the mass. The substrate electrode(s) and mass electrode(s) may be designed in the form of comb electrodes having a comb spine and comb teeth. The comb teeth of the mass electrode(s) of an electrode system may each be situated between the comb teeth of the substrate electrode of the electrode system, or vice versa.

The second and/or fourth electrode system may likewise have at least one substrate electrode provided on the substrate, and at least one mass electrode provided on the mass. In particular, the second and/or fourth electrode system may have at least one first and one second substrate electrode provided on the substrate, and one mass electrode provided on the mass. The substrate electrode(s) and mass electrode(s)

may be designed in the form of comb electrodes having a comb spine and comb teeth. The comb teeth of the mass electrode(s) of an electrode system may each be situated between one comb tooth of the first substrate electrode and one comb tooth of the second substrate electrode of the electrode system. In this manner the first and second substrate electrodes and the mass electrode of an electrode system may form a differential capacitor.

The first and third electrode systems may be situated on opposite sides of the mass. Likewise, the second and fourth electrode systems may be situated on opposite sides of the mass. The first and/or third electrode system is/are preferably situated on sides of the mass which are perpendicular to the sides of the mass on which the second and/or fourth electrode system is/are situated. For example, the comb teeth of the first electrode system may be parallel to the comb teeth of the third electrode system, and/or the comb teeth of the second electrode system may be parallel to the comb teeth of the fourth electrode system, and/or the comb teeth of the first and/or third electrode system may be perpendicular to the comb teeth of the second and/or fourth electrode system.

When the sensor includes a first and a second electrode system, and the first electrode system is a capacitor electrode system whose electrodes are designed in the form of comb electrodes having a comb spine and comb teeth, the comb teeth of the electrodes being oriented in parallel and in an interspaced and alternating manner, and moved parallel to one another when the mass is displaced along the measuring axis (capacitive comb actuator), and the second electrode system is a capacitor electrode system whose electrodes are designed in the form of comb electrodes having a comb spine and comb teeth, the comb teeth of the electrodes being oriented in parallel and in an interspaced and alternating manner, and the distance between comb teeth of the electrodes changing when the mass is displaced along the measuring axis (capacitive plate actuator), when the mass is deflected to only one side, and assuming that parasitic capacitance $C_p$ is zero, the following equations apply:

$$\frac{n_1 U_1^2}{d_C + \delta} = \frac{n_2 l_C U_2^2}{(d_C + x_0 + \delta)^2}$$

$$U_{A,0} = \frac{x_0}{d_C + \delta},$$

which may be solved for edge loss ($\delta$):

$$\delta = \frac{n_2 l_C U_2^2}{2n_1 U_1^2 (1 + U_{A,0})^2} - d_C$$

and/or for predeflection ($x_0$):

$$x0 = \frac{U_A}{U_{ref}} \frac{n_2 l_C U_2^2}{2n_1 U_1^2 (1 + U_{A,0})^2},$$

where
$n_1$=the number of comb teeth of the first electrode system,
$n_2$=the number of comb teeth of the second electrode system,
$l_C$=the effective length of the comb teeth of the second electrode system in the form of a plate capacitor,
$d_C$=the distance between the comb teeth of the first and the second electrode systems in the middle position/zero position, without edge loss,
$U_1$=the first deflection voltage,
$U_2$=the second deflection voltage, and
$U_{A,0}$=the output signal which is characteristic of the neutral position ($x_0$).

When the sensor includes a mass which is elastically supported by a U-spring and includes a first, second, third, and fourth electrode systems, and the first and third electrode systems are capacitor electrode systems situated on opposite sides of the mass and whose electrodes are designed in the form of comb electrodes having a comb spine and comb teeth, the comb teeth of the electrodes being oriented in parallel and in an interspaced and alternating manner, and moved parallel to one another when the mass is displaced along the measuring axis (capacitive comb actuator), and the second and fourth electrode systems are capacitor electrode systems situated on opposite sides of the mass and whose electrodes are designed in the form of comb electrodes having a comb spine and comb teeth, the comb teeth of the electrodes being oriented in parallel and in an interspaced and alternating manner, and the distance between comb teeth of the electrodes changing when the mass is displaced along the measuring axis (capacitive plate actuator), when the mass is deflected to two sides the following equations apply for the starting position:

$$\frac{2Y(b_f - \delta)^3 (x - x_0)}{l_f^3} + \frac{2n_1 \varepsilon_0 U_1^2}{d_C + \delta} - \frac{n_2 l_C \varepsilon_0 U_2^2}{(d_C + x + \delta)^2} = 0$$

$$\frac{2Y(b_f - \delta)^3 (x - x_0)}{l_f^3} - \frac{2n_1 \varepsilon_0 U_3^2}{d_C + \delta} + \frac{n_2 l_C \varepsilon_0 U_4^2}{(d_C - x + \delta)^2} = 0,$$

which may likewise be analytically solved for edge loss ($\delta$) and/or predeflection ($x_0$) for x=0, and which in addition to the deflection voltages include known variables such as the number and length of comb teeth, spring lengths and widths, gap width, and modulus of elasticity.

Edge loss ($\delta$) may be ascertained based on the formula:

$$\delta = \frac{1}{2} \frac{n_2}{n_1} l_C \frac{U_2^2 + U_4^2}{U_1^2 + U_3^2} - d_C,$$

and/or predeflection ($x_0$) may be ascertained based on the formula:

$$x0 = \frac{-16(U_1^2 + U_3^2)^4 n_1^5 \varepsilon_0 l_f^3 (U_1^2 U_4^2 - U_2^2 U_3^2)}{n_2 l_C Y (U_2^2 + U_4^2)^2 \left( \frac{-2b_f n_1 U_3^2 - 2b_f n_1 U_1^2 - 2d_C n_1 U_3^2 -}{2d_C n_1 U_1^2 + l_C n_2 U_2^2 + l_C n_2 U_4^2} \right)^3},$$

where:
$n_1$=the number of comb teeth of the first and third electrode systems,
$n_2$=the number of comb teeth of the second and fourth electrode systems,
$l_C$=the effective length of the comb teeth of the second and fourth electrode systems in the form of a plate capacitor,
$d_C$=the distance between the comb teeth of the first, second, third, and fourth electrode systems in the middle position/zero position, without edge loss,
$U_1$=the first deflection voltage,
$U_2$=the second deflection voltage,
$U_3$=the third deflection voltage,
$U_4$=the fourth deflection voltage, $b_f$=the spring width of the U-spring,
$l_f$=the length of a leg of the U-spring,
$\in_0$=the dielectric constant, and
Y=the modulus of elasticity of the spring material.

In another example embodiment of the method, the sensor is an acceleration sensor or a magnetic field sensor (magnetometer). In particular, the sensor may be a part of a compass, for example an electronic compass (E-compass).

The method according to the present invention may be used for a magnetic field sensor which measures a magnetic field component perpendicular to the plane of the substrate ($B_z$ magnetic field sensor) as well as for a magnetic field sensor which measures magnetic field components, in particular in two spatial directions, parallel to the plane of the substrate ($B_x/B_y$ magnetic field sensor).

For example, the method according to the present invention may be used for a magnetic field sensor which includes a substrate, an elastically suspended seismic mass which is movable relative to the substrate, at least one first and one second electrode system, for example a first, second, third, and fourth electrode systems, for deflecting the mass relative to the substrate along a measuring axis and/or for measuring the deflection of the mass relative to the substrate, the mass being movable relative to the substrate in the direction(s) perpendicular to the magnetic field component(s) to be measured, and the mass having an electrical conductor which extends, at least in places, perpendicular to the magnetic field component(s) to be measured. For $B_z$ magnetic field sensors the mass is preferably movable parallel to the plane of the substrate. For $B_x/B_y$ magnetic field sensors the mass is preferably movably situated relative to the plane of the substrate as the result of a rocker-like design.

By applying a current to the electrical conductor, on the basis of Lorentz force $F_L=I_y L_y B_z$ static sensitivity S may be ascertained, for example via a $\Delta C/C$ evaluation and the formula $S=(I_y L_y)/(d_C k_x)$, where $I_y$ is the current applied to the electrical conductor, $L_y$ is the length, in particular the effective length of the electrical conductor for the magnetic field component to be measured, $k_x$ is the stiffness of the spring, and $d_C$ is the distance between the comb teeth of the electrodes of the first and second electrode systems or of the first, second, third, and fourth electrode systems in the middle position/zero position, without edge loss. The latter two variables in particular may have a particularly great influence on the edge loss.

In another example embodiment of the method, the computation of the sensitivity, i.e., edge loss ($\delta$) and/or predeflection ($x_0$), in method step b) is therefore also based on Lorenz force $F_L$ exerted by the electrical conductor.

In another example embodiment of the method, the computation of the sensitivity, i.e., edge loss ($\delta$) and/or predeflection ($x_0$), in method step b) is based in particular on current $I_y$ applied to the electrical conductor, length $L_y$ of the electrical conductor, in particular the effective length of the electrical conductor for the magnetic field component to be measured, and stiffness $k_x$ of the spring system. For example, method step b) may be additionally based on current $I_y$ applied to the electrical conductor, length $L_y$ of the electrical conductor, in particular the effective length of the electrical conductor for the magnetic field component to be measured, stiffness $k_x$ of the spring system, and distance $d_C$ between the comb teeth of the electrodes of the first and second electrode systems or of the first, second, third, and fourth electrode systems in the middle position/zero position, without edge loss.

A further subject matter of the present invention is a sensor, in particular a micromechanical sensor, for example a sensor for capacitively detecting a mechanical deflection, which is preferably suited for carrying out a method according to the present invention, and which includes
  a substrate,
  an elastically suspended seismic mass which is movable relative to the substrate, and
  at least one first electrode system, situated on a first side of the mass, for deflecting the mass relative to the substrate along a measuring axis, and
  at least one second electrode system, situated on a second side of the mass, for deflecting the mass relative to the substrate along the measuring axis,
and which is characterized in that no electrode system is situated on the side of the mass located opposite the first side.

Such a sensor advantageously requires less surface area than a sensor having electrode systems on opposite sides, and may therefore be considered to be more cost-effective.

A further electrode system for deflecting the mass relative to the substrate along a measuring axis may optionally be situated on the side of the mass located opposite the second side.

At least one of the electrode systems may also be designed for deflecting the mass relative to the substrate for measuring the deflection of the mass relative to the substrate, for example for converting a mechanical deflection to an output signal, in particular for measuring an output signal which is characteristic of a deflection position. For example, the second and/or the further electrode system may be capacitive distance-voltage converters.

However, the sensor may also include an additional detection element for measuring the deflection of the mass relative to the substrate, for example for converting a mechanical deflection to an output signal, in particular for measuring an output signal which is characteristic of a deflection position. For example, the detection element may be a capacitive distance-voltage converter. The detection element may be a capacitor electrode system, for example, in which the distance between the electrodes changes when the mass is displaced along the measuring axis (capacitive plate actuator). However, the detection element may also be a capacitor electrode system whose electrodes move parallel to one another when the mass is displaced along the measuring axis (capacitive comb actuator). Furthermore, the detection element may be a piezoelectric converter or an electrode system based on a field effect transistor (moving gate electrode system).

The first and second electrode systems or the further electrode system preferably have different designs. In particular, the first electrode system may have a first force-distance characteristic curve, and the second electrode system may have a second force-distance characteristic curve which is different from the first.

In principle, the first, second, and further electrode systems may be independently designed as capacitive plate actuators or as capacitive comb actuators.

The first electrode system is preferably a capacitor electrode system whose electrodes move parallel to one another when the mass is displaced along the measuring axis (capacitive comb actuator), and the second and/or further electrode system(s) is/are a capacitor electrode system in which the distance between the electrodes changes when the mass is displaced along the measuring axis (capacitive plate actuator).

However, it is also possible, for example, for the first and second and/or further electrode systems to be capacitor electrode systems in which the distance between the electrodes changes when the mass is displaced along the measuring axis (capacitive plate actuators). The distance between the electrodes of the first and second electrode systems and/or of the further electrode system may be different.

The electrodes of the first and second electrode system and/or of the further electrode system are preferably designed in the form of comb electrodes having a comb spine and comb teeth. The comb teeth of the electrodes of an electrode system may each be oriented in parallel and in an interspaced and alternating manner.

The first electrode system may have at least one substrate electrode provided on the substrate, and at least one mass electrode provided on the mass. The substrate electrode(s) and mass electrode(s) may also be designed in the form of comb electrodes having a comb spine and comb teeth. The comb teeth of the mass electrode(s) of an electrode system may each be situated between the comb teeth of the substrate electrode of the electrode system, or vice versa.

The second and/or further electrode system(s) may likewise have at least one substrate electrode provided on the substrate, and at least one mass electrode provided on the mass. In particular, the second and/or further electrode system(s) may have at least one first and one second substrate electrode provided on the substrate, and may have a mass electrode provided on the mass. The substrate electrode(s) and mass electrode(s) may be designed in the form of comb electrodes having a comb spine and comb teeth. The comb teeth of the mass electrode(s) of an electrode system may each be situated between one comb tooth of the first substrate electrode and one comb tooth of the second substrate electrode of the electrode system. In this manner the first and second substrate electrodes and the mass electrode of an electrode system may form a differential capacitor.

The second and further electrode systems may be situated on opposite sides of the mass. The first electrode system is preferably situated on a side of the mass which is perpendicular to the sides of the mass at which the second and/or fourth electrode system is/are situated. For example, the comb teeth of the second electrode system may be parallel to the comb teeth of the further electrode system, and/or the comb teeth of the first electrode system may be perpendicular to the comb teeth of the second and/or further electrode system.

In particular, the sensor may be an acceleration sensor or a magnetic field sensor (magnetometer). In particular, the sensor may be part of a compass, for example an electronic compass (E-compass). For example, the sensor may be a magnetic field sensor which includes a substrate, an elastically supported seismic mass which is movable relative to the substrate, at least one first and one second electrode system, for example a first, second, and third electrode system, for deflecting the mass relative to the substrate along a measuring axis, the mass being movable relative to the substrate in the direction(s) which is/are perpendicular to the magnetic field component(s) to be measured, and the mass having an electrical conductor which extends, at least in places, perpendicular to the magnetic field component(s) to be measured. This may be a magnetic field sensor which measures a magnetic field component perpendicular to the plane of the substrate ($B_z$ magnetic field sensor), or also a magnetic field sensor which measures magnetic field components, in particular in two spatial directions, parallel to the plane of the substrate ($B_x/B_y$ magnetic field sensor). For a $B_z$ magnetic field sensor the mass is preferably movable parallel to the plane of the substrate. On the other hand, for a $B_x/B_y$ magnetic field sensor the mass is preferably movably situated relative to the plane of the substrate as the result of a rocker-like design.

A further subject matter of the present invention is a magnetic field sensor, in particular a micromechanical magnetic field sensor, which is preferably suited for carrying out a method according to the present invention, and which includes a substrate, an elastically suspended seismic mass which is movable relative to the substrate, and at least one first and one second electrode system, for example a first, second, third, and fourth electrode system, for deflecting the mass relative to the substrate along a measuring axis, the mass being movable relative to the substrate in the direction(s) which is/are perpendicular to the magnetic field component(s) to be measured, and the mass having an electrical conductor which extends, at least in places, perpendicular to the magnetic field component(s) to be measured, and which is characterized in having an evaluation device, in particular an evaluation circuit, which is designed to determine the sensitivity of the sensor without applying an external magnetic field.

In particular, the evaluation device may be designed to determine and adjust the sensitivity of the sensor without applying an external magnetic field. This may be a magnetic field sensor which measures a magnetic field component perpendicular to the plane of the substrate ($B_z$ magnetic field sensor), or also a magnetic field sensor which measures magnetic field components, in particular in two spatial directions, parallel to the plane of the substrate ($B_x/B_y$ magnetic field sensor). For a $B_z$ magnetic field sensor the mass is preferably movable parallel to the plane of the substrate. On the other hand, for a $B_x/B_y$ magnetic field sensor the mass is preferably movably situated relative to the plane of the substrate as the result of a rocker-like design.

Here as well, at least one of the electrode systems may additionally be designed for deflecting the mass relative to the substrate for measuring the deflection of the mass relative to the substrate, for example for converting a mechanical deflection to an output signal, in particular for measuring an output signal which is characteristic of a deflection position. For example, the second and/or the fourth electrode system may be capacitive distance-voltage converters.

However, the sensor may also include an additional detection element for measuring the deflection of the mass relative to the substrate, for example for converting a mechanical deflection to an output signal, in particular for measuring an output signal which is characteristic of a deflection position. For example, the detection element may also be a capacitive distance-voltage converter. The detection element may be a capacitor electrode system, for example, in which the distance between the electrodes changes when the mass is displaced along the measuring axis (capacitive plate actuator). However, the detection element may also be a capacitor electrode system whose electrodes move parallel to one another when the mass is displaced along the measuring axis (capacitive comb actuator). Furthermore, the detection element may be a piezoelectric converter or an electrode system based on a field effect transistor (moving gate electrode system).

The first and second electrode systems, and the third and fourth electrode systems, preferably have different designs. In particular, the first electrode system may have a first force-distance characteristic curve and the second electrode system may have a second force-distance characteristic curve which is different from the first.

In principle, the first and second electrode systems and/or the third and fourth electrode systems may be independently designed as capacitive plate actuators or as capacitive comb actuators.

The first and/or third electrode system is/are preferably a capacitor electrode system whose electrodes move parallel to one another when the mass is displaced along the measuring axis (capacitive comb actuator), and the second and/or fourth electrode system(s) is/are preferably a capacitor electrode system in which the distance between the electrodes changes when the mass is displaced along the measuring axis (capacitive plate actuator).

However, it is also possible, for example, for the first and second electrode systems and/or the third and fourth electrode systems to be capacitor electrode systems in which the distance between the electrodes changes when the mass is displaced along the measuring axis (capacitive plate actuators). The distance between the electrodes of the first and second electrode systems and/or of the further electrode system may be different.

The electrodes of the first and second electrode systems and/or of the third and fourth electrode systems are preferably designed in the form of comb electrodes having a comb spine and comb teeth. The comb teeth of the electrodes of an electrode system may be oriented in parallel to each other and in an interspaced and alternating manner.

The first and/or third electrode system may have at least one substrate electrode provided on the substrate, and at least one mass electrode provided on the mass. The substrate electrode(s) and mass electrode(s) may also be designed in the form of comb electrodes having a comb spine and comb teeth. The comb teeth of the mass electrode(s) of an electrode system may each be situated between the comb teeth of the substrate electrode of the electrode system, or vice versa.

The second and/or fourth electrode system may likewise have at least one substrate electrode provided on the substrate, and at least one mass electrode provided on the mass. In particular, the second and/or fourth electrode system may have at least one first and one second substrate electrode provided on the substrate, and one mass electrode provided on the mass. The substrate electrode(s) and mass electrode(s) may be designed in the form of comb electrodes having a comb spine and comb teeth. The comb teeth of the mass electrode(s) of an electrode system may each be situated between one comb tooth of the first substrate electrode and one comb tooth of the second substrate electrode of the electrode system. In this manner, the first and second substrate electrodes and the mass electrode of an electrode system may form a differential capacitor.

The first and third electrode systems, and the second and fourth electrode systems may be situated on opposite sides of the mass. The first and third electrode systems are preferably situated on sides of the mass which are perpendicular to the sides of the mass at which the second and fourth electrode systems are situated. For example, the comb teeth of the first electrode system may be parallel to the comb teeth of the third electrode system, and/or the comb teeth of the second electrode system may be parallel to the comb teeth of the fourth electrode system, and/or the comb teeth of the first and/or third electrode system may be perpendicular to the comb teeth of the second and/or fourth electrode system.

In particular, the sensor may also be part of a compass, for example an electronic compass (E-compass).

What is claimed is:

1. A method for determining the sensitivity of a sensor having a substrate, an elastically suspended seismic mass movable relative to the substrate, and at least one first electrode system for deflecting the mass relative to the substrate along a measuring axis, and at least one second electrode system for deflecting the mass relative to the substrate along the measuring axis, the method comprising:

a) applying a first deflection voltage to the first electrode system and applying a second deflection voltage to the second electrode system, and exerting a first electrostatic force on the mass by the first electrode system and exerting a second electrostatic force on the mass by the second electrode system, and exerting a restoring force on the mass as a result of the elasticity of the mass, and establishing a force equilibrium among the first electrostatic force, the second electrostatic force and the restoring force, and the mass assuming a deflection position characteristic of the force equilibrium, and measuring an output signal characteristic of the force equilibrium and of the deflection position; and b) computing the sensitivity of the sensor on the basis of the first deflection voltage and the second deflection voltage.

2. The method as recited in claim 1, wherein in method step b) the computation of the sensitivity of the sensor is based on a computation of at least one of an edge loss and predeflection.

3. The method as recited in claim 1, further comprising the following method step $a_0$) prior to method step a):

$a_0$) measuring an output signal characteristic of a starting position of the mass, while no deflection voltage is applied to the first and second electrode systems.

4. The method as recited in claim 3, wherein in method step b) the sensitivity of the sensor is computed on the basis of the first deflection voltage, the second deflection voltage, and the output signal characteristic of the force equilibrium and of the deflection position.

5. The method as recited in claim 3, wherein:

in step a), the application of the first deflection voltage to the first electrode system results in the mass being deflected from the starting position in a first direction along the measuring axis to a first deflection position, and wherein the second deflection voltage is selected such that the application of the second deflection voltage to the second electrode system results in the mass being guided from the first deflection position back to the starting position, and wherein the return of the mass back to the starting position is determined by measuring an output signal characteristic of the return to the starting position; and in step b), the sensitivity of the sensor is computed on the basis of the output signal characteristic of the starting position, the first detection voltage and the second deflection voltage.

6. The method as recited in claim 1, wherein:

the sensor further includes a third electrode system and a fourth electrode system for deflecting the mass relative to the substrate along the measuring axis;

in step a), the following are performed:

applying a first deflection voltage to the first electrode system to deflect the mass from the starting position in a first direction along the measuring axis to a first deflection position;

applying a second deflection voltage to the second electrode system to guide the mass from the first deflection position to a middle position;

determining the reaching of the middle position by measuring an output signal characteristic of the middle position;

applying a third deflection voltage to the third electrode system to deflect the mass from the starting position in a second direction opposite to the first direction and along the measuring axis to a second deflection position;

applying a fourth deflection voltage to the fourth electrode system to guide the mass from the second deflection position to the middle position; and determining the reaching of the middle position by measuring the output signal characteristic of reaching the middle position; and in step b), the sensitivity of the sensor is computed on the basis of the first, second, third, and fourth deflection voltages.

7. The method as recited in claim 6, wherein:

at least one of the first electrode system and the third electrode system is a capacitor electrode system having electrodes configured to move parallel to one another when the mass is displaced along the measuring axis; and at least one of the second electrode system and the fourth electrode system is a capacitor electrode system configured such that the distance between electrodes of the second electrode system changes when the mass is displaced along the measuring axis.

8. The method as recited in claim 6, wherein in step b), the sensitivity of the sensor is computed additionally based on a quality value determined for a spring system used to elastically suspend the seismic mass.

9. The method as recited in claim 6, wherein the sensor is one of an acceleration sensor or a magnetic field sensor.

10. The method as recited in claim 9, wherein:

the sensor is a magnetic field sensor;

the mass is configured to be movable relative to the substrate in at least one direction perpendicular to a magnetic field component to be measured; and the mass has an electrical conductor extending perpendicular to the magnetic field component to be measured.

11. The method as recited in claim 10, wherein in step b), the sensitivity of the sensor is computed additionally based on the Lorenz force exerted by the electrical conductor.

\* \* \* \* \*